United States Patent
Song et al.

(10) Patent No.: US 7,961,026 B2
(45) Date of Patent: Jun. 14, 2011

(54) DELAY CELL AND PHASE LOCKED LOOP USING THE SAME

(75) Inventors: Taek-Sang Song, Kyoungki-do (KR); Kyung-Hoon Kim, Kyoungki-do (KR); Dae-Han Kwon, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 30 days.

(21) Appl. No.: 12/003,676

(22) Filed: Dec. 31, 2007

(65) Prior Publication Data

US 2008/0238502 A1    Oct. 2, 2008

(30) Foreign Application Priority Data

Mar. 31, 2007   (KR) .................. 10-2007-0032086
May 16, 2007    (KR) .................. 10-2007-0047499

(51) Int. Cl.
*H03H 11/26* (2006.01)
(52) U.S. Cl. ......... 327/266; 327/274; 327/280; 327/287
(58) Field of Classification Search .................. 327/266, 327/274, 280, 287
See application file for complete search history.

(56) References Cited

U.S. PATENT DOCUMENTS

| | | | |
|---|---|---|---|
| 4,792,768 A | 12/1988 | Fried et al. | |
| 6,043,719 A * | 3/2000 | Lin et al. | 331/57 |
| 6,771,105 B2 * | 8/2004 | Andrasic et al. | 327/276 |
| 6,900,703 B2 | 5/2005 | Garvin | |
| 6,943,608 B2 * | 9/2005 | Kelkar | 327/274 |
| 7,176,737 B2 | 2/2007 | Baker et al. | |
| 7,541,854 B2 * | 6/2009 | Lee | 327/266 |

FOREIGN PATENT DOCUMENTS

| | | |
|---|---|---|
| KR | 10-1998-0011459 | 4/1998 |
| KR | 10-2001-0035839 | 5/2001 |
| KR | 10-0360626 | 11/2002 |
| KR | 10-2004-0072083 | 8/2004 |
| KR | 10-2005-0039247 | 4/2005 |
| KR | 10-2005-0113969 | 12/2005 |
| KR | 10-2006-0015206 | 2/2006 |
| WO | WO 99/37024 | 7/1999 |

OTHER PUBLICATIONS

Korean Office Action, with English Translation, issued in Korean Patent Application No. KR 10-2007-0047499, dated May 20, 2008.
Korean Office Action issued in Korean Patent Application No. KR 10-2007-0032086 dated on Aug. 13, 2008.
Korean Office Action issued in Korean Patent Application No. KR 10-2007-0047499 dated on Aug. 19, 2008.

* cited by examiner

*Primary Examiner* — Kenneth B. Wells
(74) *Attorney, Agent, or Firm* — IP & T Group LLP

(57) ABSTRACT

A phase locked loop that generates an internal clock by controlling a delay time of a delay cell according to conditions of PVT, thereby improving a jitter characteristic of the internal clock. The delay cell includes a first current controller for controlling first and second currents in response to a control voltage, and a second current controller for controlling the first and second currents in response to frequency range selection signals. The phase locked loop includes a phase comparator for comparing a reference clock with a feedback clock, a control voltage generator for generating a control voltage corresponding to an output of the phase comparator, and a voltage controlled oscillator for generating an internal clock having a frequency in response to the control voltage and one or more frequency range control signals, wherein the feedback clock is generated using the internal clock.

13 Claims, 7 Drawing Sheets

DELAY CELL AND PHASE LOCKED LOOP USING THE SAME

CROSS-REFERENCE TO RELATED APPLICATIONS

This application claims priority of Korean patent applications Nos. 10-2007-0032086 & 10-2007-0047499, filed in the Korean Patent Office on Mar. 31, 2007 & May 16, 2007 respectively, which are incorporated by reference in its entirety.

BACKGROUND OF THE INVENTION

The subject matter relates to a semiconductor memory device; more particularly, to a phase locked loop with a delay cell for controlling a time taken for an input signal to be output using a control voltage.

Generally, semiconductor memory devices, such as a double data rate synchronous DRAM, use an external clock as a reference for conforming with various operating timings. However, after the external clock is input to the semiconductor memory device, a clock skew may be introduced by delays in internal circuits through which the external clock passes. The semiconductor memory device is provided with a clock synchronization circuit to compensate for clock skew. The clock synchronization circuit generally includes a phase locked loop (PLL) or a delay locked loop (DLL). The semiconductor memory device transmits data to external devices using an internal clock CLK_INN output by the clock synchronization circuit.

When the frequency of the internal clock CLK_INN is different from an external clock, a PLL is used as a clock synchronization circuit because it provides a frequency multiplexing function. When the internal clock CLK_INN has substantially the same frequency as an external clock, a DLL is usually used. A PLL and a DLL have substantially similar structures. However, with respect to generating the internal clock CLK_INN, a PLL using a voltage controlled oscillator is distinguished from a DLL using a voltage delay line.

FIG. 1 is a block diagram illustrating a conventional phase locked loop (PLL). The conventional PLL includes a phase comparator 100, a control voltage generator 120, a voltage controlled oscillator 140 and a frequency divider 160.

The phase comparator 100 compares a reference clock CLK_REF corresponding to an external clock with a feedback clock CLK_FED output by the frequency divider 160. The control voltage generator 120 generates a control voltage V_CTR in response to an output of the phase comparator 100. The voltage controlled oscillator 140 generates an internal clock CLK_INN in response to the control voltage V_CTR with a frequency corresponding to the control voltage V_CTR. The frequency divider 160 generates a feedback clock CLK_FED by dividing the internal clock CLK_INN. The PLL generates the control voltage V_CTR in response to a phase difference detected between the reference clock CLK_REF and the feedback clock CLK_FED, and then generates the internal clock CLK_INN with a frequency corresponds to the level of the control voltage V_CTR.

FIG. 2 is a schematic circuit diagram illustrating the voltage controlled oscillator 140 described in FIG. 1. The voltage controlled oscillator 140 includes a plurality of delay cells 200, 220, 240 and 260 connected in series, each receiving the control voltage V_CTR.

The first to fourth delay cells 200, 220, 240 and 260 respectively control an output delay for an input signal according to the control voltage V_CTR. For example, assuming that each of the delay cells 200, 220, 240 and 260 has a delay value of tD corresponding to the control voltage V_CTR, the signal input to the voltage controlled oscillator 140 is delayed by a period 4tD after passing through the delay cells 200, 220, 240 and 260. Accordingly, when the delay value tD decreases according to the control voltage V_CTR, the internal clock CLK_INN is output with a higher frequency. Alternatively, the internal clock CLK_INN is output with a lower frequency corresponding to a converse change in the control voltage V_CTR.

FIG. 3 is a schematic circuit diagram illustrating a delay cell described in FIG. 2. Because the plurality of delay cells 200 to 260 have substantially the same structure, only one delay cell is described in detail.

In the delay cell, a control voltage V_CTR determines a time taken for differential input signals IN and /IN to be outputted as first and second differential output signals OUT and /OUT. Assuming that the input signals IN and /IN are logic high and low levels, respectively, the second differential output signal /OUT increases to a predetermined level by a second current I2. Because a first current I1 sinks to a ground terminal VSS, the first differential output signal OUT deceases. Consequently, the differential output signals OUT and /OUT are transmitted to the next delay cell after the delay time determined by the control voltage V_CTR, which becomes one unit delay value.

If the control voltage V_CTR is decreased, the amount of the first and second currents I1 and I2 increases. The delay time taken for the differential output signals OUT and /OUT to reach a predetermined level decreases. In contrast, when the control voltage V_CTR is increased, the amount of the first and second currents I1 and I2 decreases. The delay time taken for the differential output signals OUT and /OUT to reach a predetermined level increases. Accordingly, the delay time of the delay cell is determined by the control voltage V_CTR.

FIG. 4 is a graph illustrating an output frequency FRE_VCO of the internal clock according to the control voltage V_CTR in the voltage controlled oscillator 140.

Referring to FIGS. 3 and 4, as the control voltage V_CTR increases, it strengthens the turning-off state of PMOS transistors PM1 and PM2 and the first and second currents I1 and I2 decrease. Accordingly, the output frequency FRQ_VCO of the internal clock CLK_INN decreases to the extent of a minimum output frequency FRQ_MIN.

As the control voltage V_CTR decreases, it strengthens the turning-on state of PMOS transistors PM1 and PM2 and the first and second current I1 and I2 increase more and more. Accordingly, the output frequency FRQ_VCO of the internal clock CLK_INN increases to the extent of a maximum output frequency FRQ_MAX. A change range of the output frequency FRQ_VCO according to the control voltage V_CTR is defined as a gain of the voltage controlled oscillator 140 and indicated as K_VCO in the specification. The gain K_VCO can be calculated by the following equation.

$$K\_VCO = \frac{FRQ\_MAX - FRQ\_MIN}{\Delta V\_CTR} \quad \text{(Equation 1)}$$

Referring to FIG. 4, the frequency FRE_VCO output according to the control voltage V_CTR can vary due to conditions of process, voltage and temperature (PVT). Because operation speed of the PMOS and NMOS transistors in FIG. 3 is affected by the condition of PVT, the delay time of the delay cell can vary even under an identical control voltage V_CTR. Thus, the generated output frequency FRQ_VCO is sensitive to the conditions of PVT.

The conditions of PVT determining the output frequency FRQ_VCO are classified in this disclosure into three types of cases: TYPICAL, FAST and SLOW. When the operation speed of the PMOS and NMOS transistors is typical, the condition of PVT is a typical case, i.e., the type TYPICAL. When the operation speed of the PMOS and NMOS transistors is faster than the typical case, the condition of PVT is a fast case, i.e., the type FAST. When the operation speed of the PMOS and NMOS transistors is slower than the typical case, the condition of PVT is a slow case, i.e., the type SLOW. In FIG. 4, the linear graph PVT_T represents the output frequency FRQ_VCO according to the control voltage V_CTR in the typical case, the linear graph PVT_F represents the output frequency FRQ_VCO according to the control voltage V_CTR in the fast case, and the linear graph PVT_S represents the output frequency FRQ_VCO according to the control voltage V_CTR in the slow case.

Accordingly, an unintended output frequency FRQ_VCO may be generated or the voltage controlled oscillator 140 may have an unintended characteristic due to the condition of PVT even if the voltage controlled oscillator 140 is designed to generate the output frequency FRQ_VCO within a predetermined range. That is, as the condition of PVT changes from the typical case to the fast case, the voltage controlled oscillator 140 which is designed to output a target range for output frequency FRQ_VCO (FRQ_MAX-FRQ_MIN) according to the change of the control voltage V_CTR (ΔV_CTR) in the typical case, it outputs the output frequency FRQ_VCO out of the target range, as the output frequency FRQ_VCO changes more in response to the changes in the control voltage V_CTR (ΔV_CTR). Accordingly, the jitter characteristic of the output signal of the voltage controlled oscillator 140, i.e., the internal clock CLK_INN, deteriorates.

In the slow case, the output frequency FRQ_VCO changes less in response to the changes in the control voltage V_CTR (ΔV_CTR). While the jitter characteristic of the output signal of the voltage controlled oscillator 140 is improved, the voltage controlled oscillator 140 outputs only part of the target range for the output frequency FRQ_VCO. The voltage controlled oscillator 140 in the slow case cannot output the other part of the range.

In addition, semiconductor memory devices are required to operate faster and the maximum value of the output frequency FRQ_VCO is required to be higher. However, by expanding the target range for the output frequency FRQ_VCO in response to the control voltage V_CTR, it causes a problem that the output frequency FRQ_VCO becomes more sensitive to minor fluctuations of the control voltage V_CTR. Accordingly, the jitter characteristic of the internal clock CLK_INN deteriorates.

SUMMARY OF THE INVENTION

Embodiments of the present invention are directed to providing a phase locked loop for generating an internal clock by controlling a delay time of a delay cell according to conditions of PVT.

They also provide a phase locked loop for generating an internal clock in which a frequency has an improved jitter characteristic.

In accordance with an aspect of the present invention, a delay cell includes a first current controller for controlling first and second currents flowing through first and second nodes in response to a control voltage, a signal input unit for outputting differential output signals respectively corresponding to the first and second currents in response to differential input signals, and a second current controller for controlling the first and second currents in response to frequency range selection signals.

In accordance with an another aspect of the present invention, a phase locked loop includes a phase comparator for comparing a reference clock with a feedback clock, a control voltage generator for generating a control voltage in response to an output of the phase comparator, and a voltage controlled oscillator for generating an internal clock having a frequency corresponding to the control voltage and frequency range selection signals, wherein the feedback clock is generated in response to the internal clock.

DESCRIPTION OF SPECIFIC EMBODIMENTS

According to some embodiments of the present invention, phase locked loop is able to better control a delay time of a delay cell despite varying conditions of PVT. Accordingly, a jitter characteristic of an internal clock, which otherwise deteriorates due to changed conditions of PVT, is improved and the frequency of the internal clock is provided within a target range stably even if the conditions of PVT change. Thus, a semiconductor memory operates more stably using the resultant internal clock.

In addition, a wider frequency range can be provided for the internal clock without deterioration of the jitter characteristic of the internal clock. Thus, internal clock can be generated stably, even at high frequencies.

Hereinafter, an impedance matching circuit in accordance with specific embodiments of the present invention will be described in detail, referring to accompanying drawings.

Figure 5:
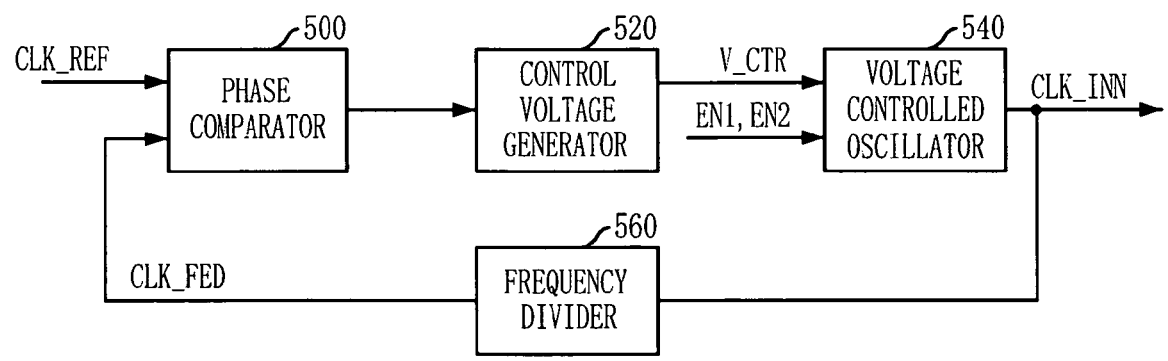
FIG. 5 is a block diagram illustrating a phase locked loop in accordance with an embodiment of the present invention.

FIG. 5 is a block diagram illustrating a phase locked loop (PLL) in accordance with an embodiment of the present invention. The PLL includes a phase comparator 500, a control voltage generator 520, a voltage controlled oscillator 540. A frequency divider 560 may be further included in the PLL.

The phase comparator 500 compares a reference clock CLK_REF corresponding to an external clock with a feedback clock CLK_FED outputted the frequency divider 560.

The control voltage generator 520 generates a control voltage V_CTR corresponding to an output of the phase comparator 500. The voltage controlled oscillator 140 generates an internal clock CLK_INN which has a frequency corresponds to the control voltage V_CTR and frequency range selection signals EN1 and EN2. The frequency divider 560 generates the feedback clock CLK_FED by dividing the internal clock CLK_INN. The frequency range selection signals EN1 and EN2 have information about the frequency of the internal clock CLK_INN and may be generated using a mode register set (MRS) or a fuse option circuit. The frequency range selection signals EN1 and EN2 are explained in each embodiment once again. In conclusion, the PLL generates the control voltage V_CTR corresponding to a phase difference between the reference clock CLK_REF and the feedback clock CLK_FED, and then generates the internal clock CLK_INN which of frequency corresponds to the level of the control voltage and the frequency range selection signals EN1 and EN2.

Figure 1:
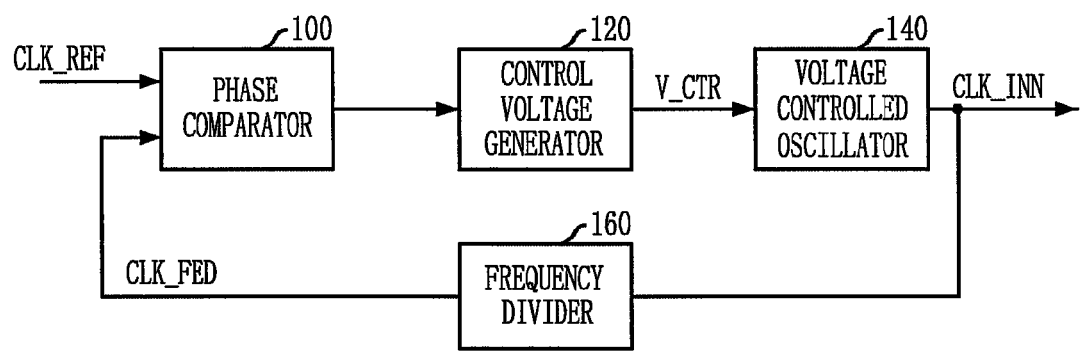
FIG. 1 is a block diagram illustrating a conventional phase locked loop.
Figure 2:
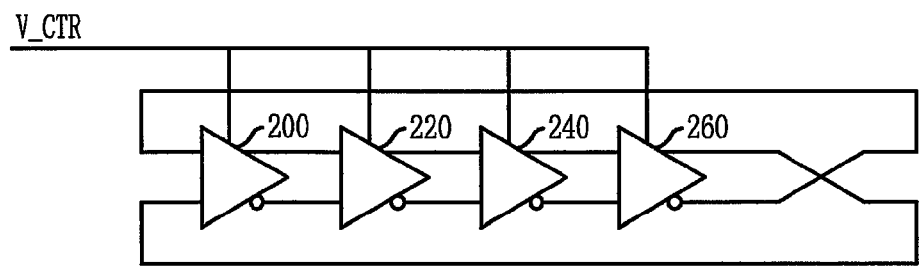
FIG. 2 is a schematic circuit diagram illustrating a voltage controlled oscillator described in FIG. 1.
Figure 3:
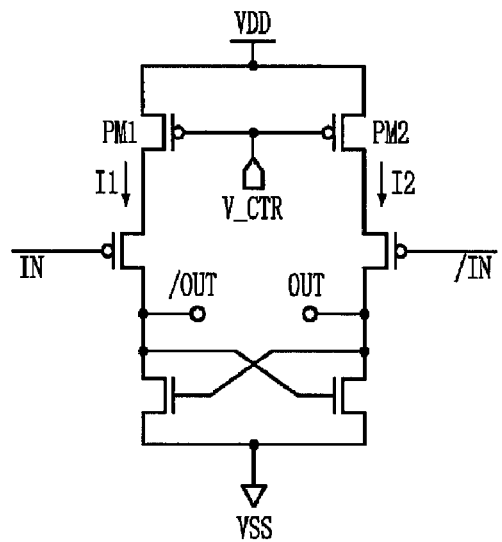
FIG. 3 is a schematic circuit diagram illustrating a delay cell described in FIG. 2.
Figure 6:
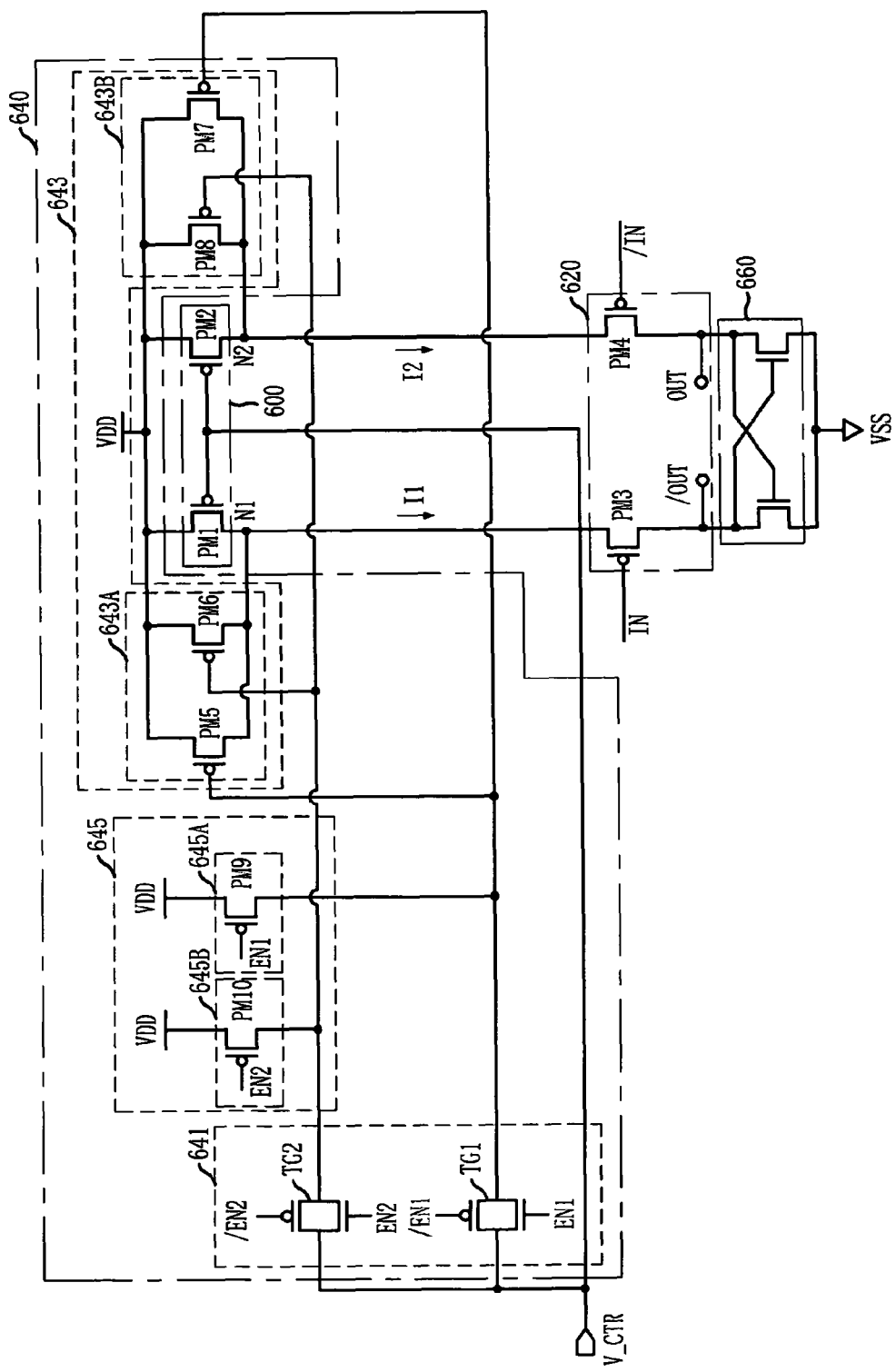
FIG. 6 is a schematic circuit diagram illustrating a delay cell in accordance with a first embodiment of the present invention.

FIG. 6 is a schematic circuit diagram illustrating a delay cell in accordance with a first embodiment of the present invention. Much as with the voltage controlled oscillator 140 depicted in FIG. 2, the voltage controlled oscillator 540 is provided with a plurality of delay cells connected in series. One of these delay cells is described in detail below.

The delay cell includes a first current controller 600, a signal input unit 620, and a second current controller 640. The first current controller 600 controls currents I1 and I2 flowing to nodes N1 and N2 in response to the control voltage V_CTR. The signal input unit 620 outputs differential output signals /OUT and OUT respectively corresponding to the currents I1 and I2 in response to differential input signals IN and /IN. The second current controller 640 controls the currents I1 and I2 in response to frequency range selection signals EN1 and EN2. The frequency range selection signals EN1 and EN2 are skew information signals having information about conditions of PVT. A loading unit 660 which is cross coupled between the signal input unit 620 and a ground voltage terminal VSS may be further included.

The first current controller 600 includes PMOS transistors PM1 and PM2. A first PMOS transistor PM1 is connected in the direction of source-drain between a supply voltage terminal VDD and a first node N1. A second PMOS transistor PM2 is connected in the direction of source-drain between a supply voltage terminal VDD and a second node N2. The first and second PMOS transistors PM1 and PM2 receive the control voltage V_CTR through their gates.

The signal input unit 620 includes PMOS transistors PM3 and PM4. A third PMOS transistor PM3 is connected in the direction of source-drain between the first node N1 and a first differential output terminal, receiving a first differential input signal IN through a gate. A fourth PMOS transistor PM4 is connected in the direction of source-drain between the second node N2 and a second differential output terminal, receiving a second differential input signal /IN through a gate.

The second current controller 640 includes a transmitting unit 641, a current supplying unit 643 and an inactivating unit 645. The transmitting unit 641 transmits the control voltage V_CTR in response to the frequency range selection signals EN1 and EN2. The current supplying unit 643 supplies currents to the nodes N1 and N2 in response to outputs of the transmitting unit 641. The inactivating unit 645 inactivates the current supplying unit 643 in response to the frequency range selection signals EN1 and EN2.

The transmitting unit 641 includes first and second transfer gates TG1 and TG2. The first and second transfer gates TG1 and TG2 transmit the control voltage V_CTR to the current supplying unit 643 in response to the frequency range selection signals EN1 and EN2, and inverted frequency range selection signals EN1/ and EN2/.

The current supplying unit 643 includes first and second current supplying units 643A and 643B for supplying currents to the first and second nodes N1 and N2, respectively. The first current supplying unit 643A includes PMOS transistors PM5 and PM6. A fifth PMOS transistor PM5 is connected in the direction of source-drain between the supply voltage terminal VDD and the first node N1, receiving an output of the first transfer gate TG1 through a gate. A sixth PMOS transistor PM6 is connected in the direction of source-drain between the supply voltage terminal VDD and the first node N1, receiving an output of the second transfer gate TG2 through a gate.

The second current supplying unit 643B includes PMOS transistors PM7 and PM8. A seventh PMOS transistor PM7 is connected in the direction of source-drain between the supply voltage terminal VDD and the second node N2, receiving an output of the first transfer gate TG1 through a gate. An eighth PMOS transistor PM8 is connected in the direction of source-drain between the supply voltage terminal VDD and the second node N2, receiving an output of the second transfer gate TG2 through a gate.

The inactivating unit 645 includes first and second inactivating units 645A and 645B. The first inactivating unit 645A inactivates the fifth and seventh transistors PM5 and PM7 in response to the first frequency range selection signal EN1. The second inactivating unit 645B inactivates the sixth and eighth transistors PM6 and PM8 in response to the second frequency range selection signal EN2. The first inactivating unit 645A includes a ninth PMOS transistor PM9, which is connected in the direction of source-drain between the supply voltage terminal VDD and an output terminal of the first transfer gate TG1 and receives the first frequency range selection signal EN1 through a gate. The second inactivating unit 645B includes a tenth PMOS transistor PM10, which is connected in the direction of source-drain between the supply voltage terminal VDD and an output terminal of the second transfer gate TG2 and receives the second frequency range selection signal EN2 through a gate.

An operation of the delay cell in accordance with the first embodiment is described below.

The frequency range selection signals EN1 and EN2 are controlled according to the conditions of PVT. For example, when the condition of PVT is the typical case, the first frequency range selection signal EN1 is logic high and the second frequency range selection signal EN2 is logic low.

Then the first and second PMOS transistors PM1 and PM2 supply currents to the first and second nodes N1 and N2 according to the control voltage V_CTR. The ninth PMOS transistor PM9 of the first inactivating unit 645A turns off in response to the first frequency range selection signal EN1, and the first transfer gate TG1 is activated. Accordingly, the fifth and seventh PMOS transistors PM5 and PM7 are provided with the control voltage V_CTR, and respectively supply currents to the first and second nodes N1 and N2. As a result, when the condition of PVT is the typical case, the first and fifth PMOS transistors PM1 and PM5 supply currents to the first node N1 and the second and seventh PMOS transistors PM2 and PM7 supply currents to the second node N2.

When the condition of PVT is the fast case, the first and second frequency range selection signals EN1 and EN2 are both logic low.

Then the first and second PMOS transistors PM1 and PM2 supply currents to the first and second nodes N1 and N2, as in the typical case. The ninth and tenth PMOS transistors PM9 and PM10 of the inactivating unit 645 turns on in response to the first and second frequency range selection signals EN1 and EN2. The first and second transfer gates TG1 and TG2 are inactivated. Accordingly, the control voltage V_CTR is not provided to the first and second current supplying units 643A and 643B, and there is no additional current supplied to the first and second nodes N1 and N2. In the result, when the condition of PVT is the fast case, only the first PMOS transistor PM1 supplies current to the first node N1 and only the second PMOS transistor PM2 supplies current to the second node N2.

When the condition of PVT is the slow case, the first and second frequency range selection signals EN1 and EN2 are both logic high.

Then the first and second PMOS transistors PM1 and PM2 supply currents to the first and second nodes N1 and N2, as in the typical and fast cases. The ninth and tenth PMOS transistors PM9 and PM10 of the inactivating unit 645 turns off in response to the first and second frequency range selection signals EN1 and EN2. The first and second transfer gates TG1 and TG2 are both activated. Accordingly, the first and second current supplying units 643A and 643B supply additional currents to the first and second nodes N1 and N2 in response to the control voltage V_CTR. As a result, when the condition of PVT is the slow case, the first, fifth and sixth PMOS transistors PM1, PM5 and PM6 supply currents to the first node N1 and the second, seventh and eighth PMOS transistors PM2, PM7 and PM8 supply currents to the second node N2.

Figure 7:
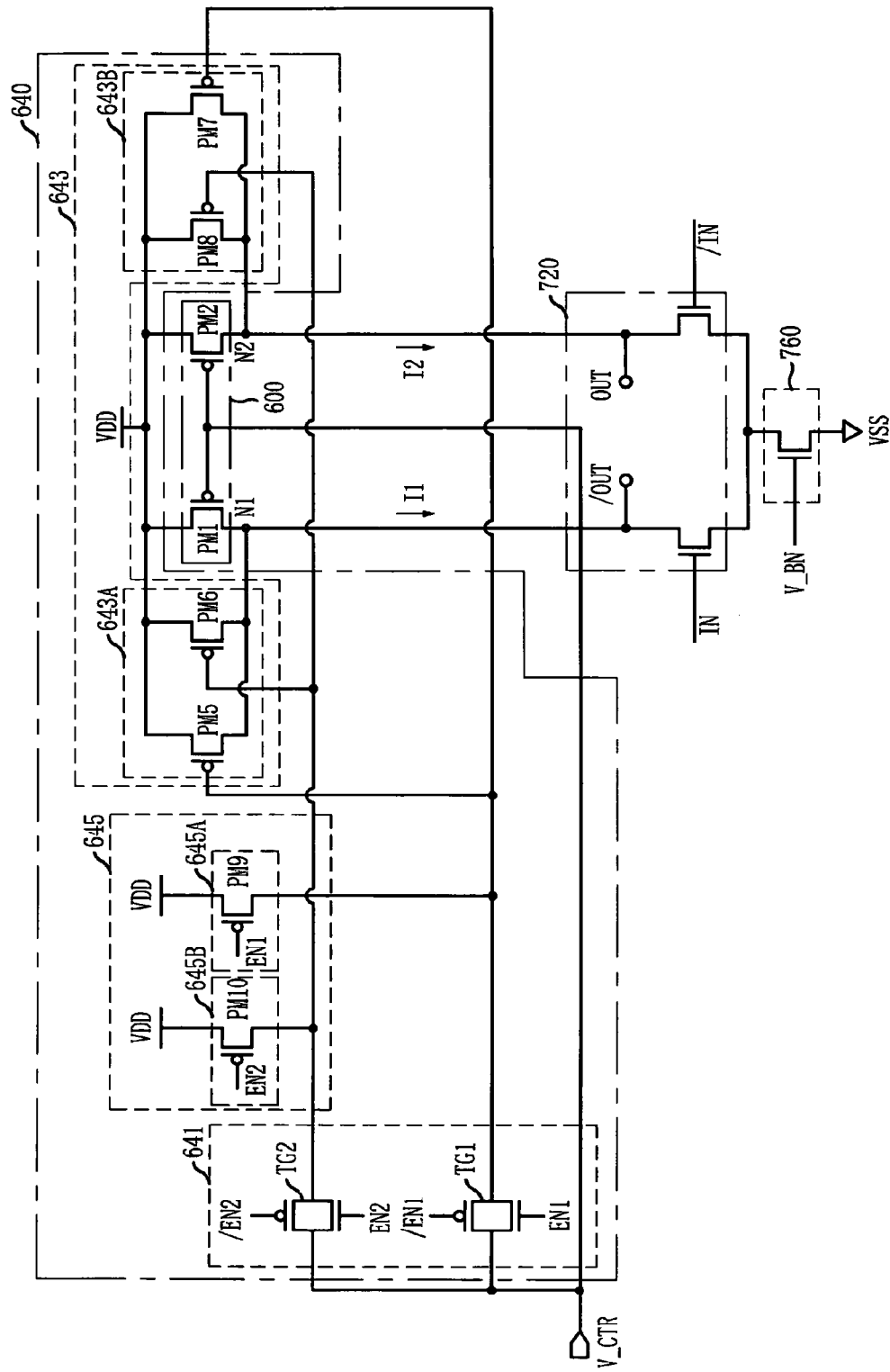
FIG. 7 is a schematic circuit diagram illustrating a delay cell in accordance with a second embodiment of the present invention.

FIG. 7 is a schematic circuit diagram illustrating a delay cell in accordance with a second embodiment of the present invention. Notations identical to those in FIG. 6 indicate components identical to those in FIG. 6.

The delay cell in accordance with the second embodiment includes a sinking unit 760 for sinking a predetermined current in response to a bias voltage V_BN, rather than including the loading unit 660 in accordance with the first embodiment. As a result, first and second nodes N1 and N2 are used as differential output terminals respectively, and signal input unit 720 for receiving differential input signals IN and /IN is provided between the differential output terminals and the sinking unit 760. The bias voltage V_BN has a voltage level to sink an intended current by turning on a NMOS transistor in the singing unit 760.

Much of the second embodiment operates in a manner similar to the discussion of the first embodiment. Thus, such aspects of the second embodiment are not described in detail.

As is the first embodiment, when the condition of PVT is the typical case, two pairs of PMOS transistors control currents flowing to the first and second nodes N1 and N2. When the condition of PVT is the slow case, three pairs of PMOS transistors control currents flowing to the first and second nodes N1 and N2. When the condition of PVT is the fast case, one pair of PMOS transistors control currents flowing to the first and second nodes N1 and N2. Consequently, as the condition of PVT varies among the typical, slow and fast cases, currents supplied to the first and second nodes N1 and N2 are accordingly controlled. Thus, although the condition of PVT changes, identical delay time may be applied to input signals, and the frequency of the internal clock CLK_INN can remain identical although the condition of PVT changes.

Figure 4:
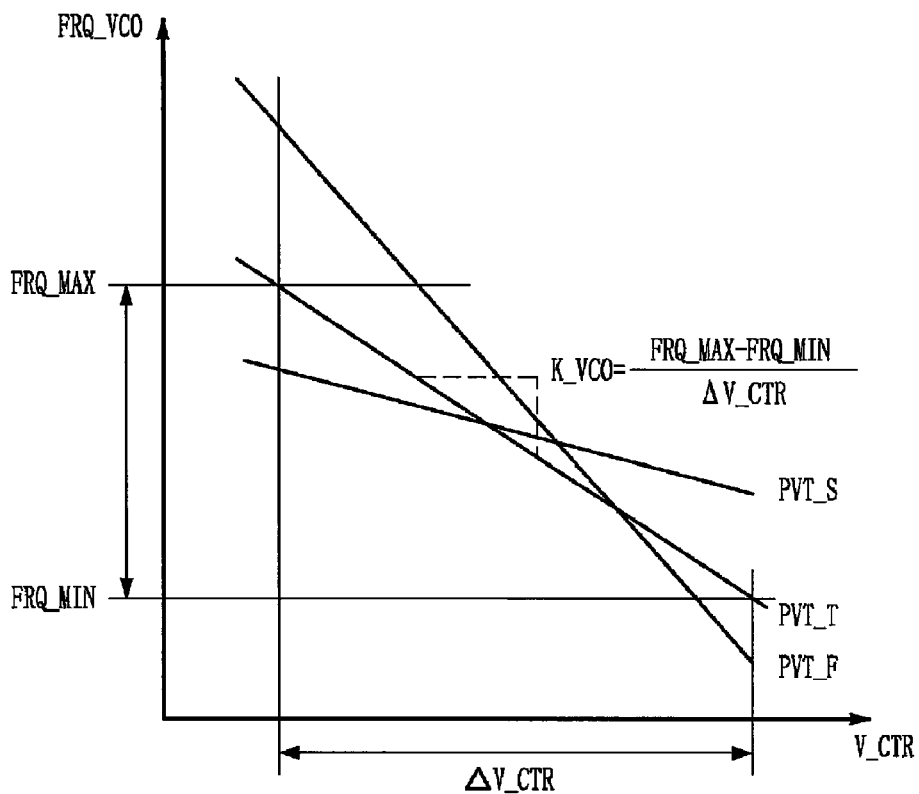
FIG. 4 is a graph illustrating an output frequency of an internal clock according to a control voltage in the voltage controlled oscillator of FIG. 2.

Referring to FIG. 4, it is assumed that a target frequency range is a frequency range according to a change in the control voltage ($\Delta$V_CTR) in the typical case, i.e., FRQ_MAX to FRQ_MIN. In the slow case, currents are controlled to flow to the first and second nodes N1 and N2 more than in the typical case, so that the slope of a linear graph PVT_S increases. In the fast case, currents are controlled to flow to the first and second nodes N1 and N2 less than in the typical case, so that the slope of a linear graph PVT_F decreases.

In addition, a phase locked loop for generating an internal clock in which a frequency has an improved jitter characteristic will be described in detail referring to another embodiment.

Figure 8:
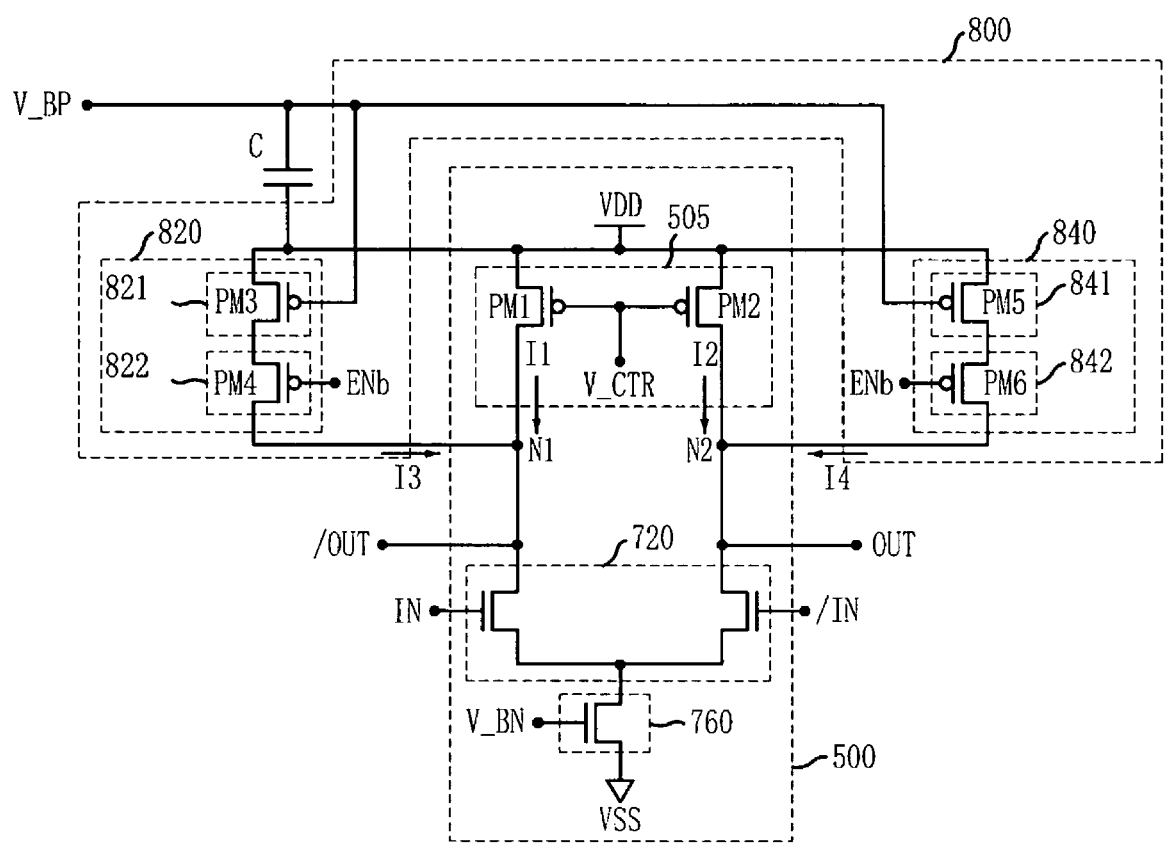
FIG. 8 is a schematic circuit diagram illustrating a delay cell in accordance with a third embodiment of the present invention.

FIG. 8 is a schematic circuit diagram illustrating a delay cell in accordance with a third embodiment of the present invention. Notations identical to those in FIG. 7 indicate components identical to those in FIG. 7. The delay cell includes a second current controller 800 for supplying predetermined currents I3 and I4 to first and second nodes N1 and N2 respectively in response to a frequency range selection signal ENb. The frequency range selection signal ENb conveys information about the frequency of the internal clock CLK_INN and may be generated using a mode register set (MRS) or a fuse option circuit.

The second current controller 800 includes first and second current supplying units 820 and 840. The first current supplying unit 820 supplies a third current I3 to the first node N1. The second current supplying unit 840 supplies a fourth current I4 to the second node N2.

The first current supplying unit 820 includes a first current generator 821 and a first current transmitter 822. The first current generator 821 generates the third current I3 in response to a second bias voltage V_BP. The first current transmitter 822 transmits the third current I3 to the first node N1 in response to the frequency range selection signal ENb. The first current generator 821 includes a third PMOS transistor PM3. The third PMOS transistor PM3 is connected in the direction of source-drain between a supply voltage terminal VDD and a first current transmitter 822. The third PMOS transistor PM3 receives the second bias voltage V_BP through a gate. The first current transmitter 822 includes a fourth PMOS transistor PM4. The fourth PMOS transistor PM4 is connected in the direction of source-drain between the third PMOS transistor PM3 and the first node N1. The fourth MOS transistor PM4 receives the frequency range selection signal ENb through a gate.

In addition, the second current supplying unit 840 includes a second current generator 841 and a second current transmitter 842. The second current generator 841 generates the fourth current I4 in response to the second bias voltage V_BP. The second current transmitter 842 transmits the fourth current I4 to the second node N2 in response to the frequency range selection signal ENb. The second current generator 841 includes a fifth PMOS transistor PM5. The fifth PMOS transistor PM5 is connected in the direction of source-drain between the supply voltage terminal VDD and a second current transmitter 842. The fifth PMOS transistor PM5 receives the second bias voltage V_BP through a gate. The second current transmitter 842 includes a sixth PMOS transistor PM6. The sixth PMOS transistor PM6 is connected in the direction of source-drain between the fifth PMOS transistor PM5 and the second node N2. The sixth MOS transistor PM6 receives the frequency range selection signal ENb through a gate The first and second bias voltages V_BN and V_BP have predetermined voltage levels and are generated by a band gap circuit. The band gap circuit is omitted in the depiction of the third embodiment. A capacitor C is provided between the supply voltage terminal VDD and an output terminal of the band gap circuit for more stable operation.

An operation of the delay cell in accordance with the third embodiment is described below on the basis of a second differential output terminal.

When the frequency range selection signal ENb is logic high, it is much the same as when the first and second frequency range control signals EN1 and EN2 are both logic low in the first embodiment. The first and second current transmitters 822 and 842 are inactivated. Accordingly, first and second PMOS transistors PM1 and PM2 respectively supply currents to the first and second nodes N1 and N2 according to the control voltage V_CTR. There is no additional current supplied to the first and second nodes N1 and N2. In the case where the second PMOS transistor PM2 is fully turned on by the control voltage V_CTR, a resultant delay time of the delay cell is defined as a first delay time.

When the frequency range selection signal ENb is logic low, a predetermined level of currents I3 and I4 is supplied to the first and second nodes N1 and N2 respectively by the second current controller 800 without respect to the control voltage V_CTR. Accordingly, even when the second PMOS transistor PM2 is fully turned off by the control voltage V_CTR, a fourth current I4, i.e., the predetermined level of current flows to the second differential output terminal. A resultant delay time of the delay cell under these conditions is defined as a second delay time for the convenience of explanation. Also, a current flows increasingly faster into the second differential output terminal as the second PMOS transistor PM2 is increasingly turned on by the control voltage V_CTR. In the case where the second PMOS transistor PM2 fully turns on, a resultant delay time of the delay cell is defined as third delay time.

Consequently, the delay cell of the present invention is able to secure a delay times ranging from a delay time, when the second PMOS transistor PM2 fully turns off, to the first delay time, when the second PMOS transistor PM2 is fully turned on by the control voltage V_CTR. In addition, the delay cell is able to secure another delay time ranging from the second delay time when the second PMOS transistor PM2 fully turns off and the fourth current I4 is supplied by the frequency range selection signal ENb, to the third delay time, when the second PMOS transistor PM2 fully turns on and the fourth current I4 is supplied by the frequency range selection signal ENb. By applying these operations, the delay cell in accordance with the third embodiment improves the jitter characteristic of the output signal and better controls a target frequency range of the output signal.

Figure 9:
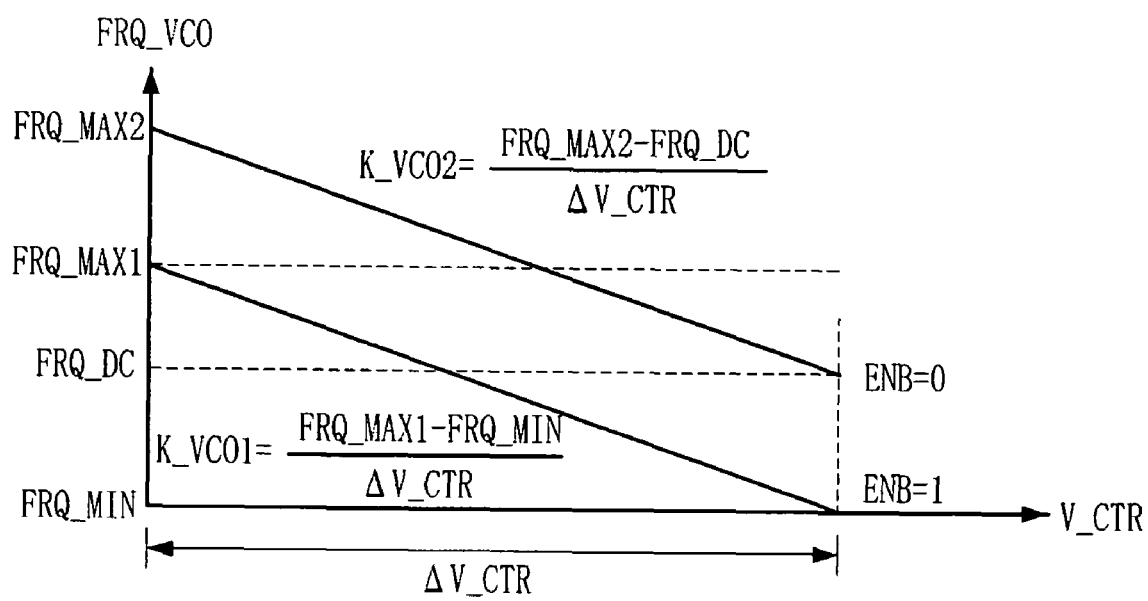
FIG. 9 is a graph illustrating an output frequency of an internal clock according to a control voltage in a voltage controlled oscillator in accordance with the third embodiment of the present invention.

FIG. 9 is a graph illustrating an output frequency of the internal clock according to the control voltage in the voltage controlled oscillator in accordance with the third embodiment of the present invention.

Referring to FIGS. 8 and 9, a minimum output frequency FRQ_MIN of the internal clock is secured when the frequency range selection signal ENb is logic high and the second PMOS transistor PM2 fully turns off. From that point, the output frequency increases to a first output frequency FRQ_MAX1 according to the first delay time when the second PMOS transistor PM2 is fully turned on by the control voltage V_CTR. In addition, a second output frequency FRQ_DC is secured by the frequency range selection signal ENb having a logic low level if the second PMOS transistor PM2 fully turns off. From that point, the output frequency increases to a maximum output frequency FRQ_MAX2 according to the third delay time when the second PMOS transistor PM2 is fully turned on by the control voltage V_CTR.

Accordingly, a voltage controlled oscillator in accordance with the disclosure can generate an internal clock with a first frequency range, ranging from the minimum output frequency FRQ_MIN to the first output frequency FRQ_MAX1. The voltage controlled oscillator can also generate the internal clock with a second frequency range, ranging from the second output frequency FRQ_DC to the maximum output frequency FRQ_MAX2 in response to the frequency range selection signal ENb. At least some of the frequencies in the first frequency range are lower than the frequencies of the second frequency range. There is a margin of overlap between the first and second frequency ranges for stable operation in some embodiments of the present invention. That is, the second output frequency FRQ_DC is set to be lower that the first output frequency FRQ_MAX1. It is desirable for the second output frequency FRQ_DC to be set to a level wherein the output frequency ranges have a minimized overlap but are continuous. And then, the frequency range selection signal ENb is set to a logic high level in case that a target frequency of the internal clock is within the first frequency range. Alternatively, the frequency range selection signal ENb is set to a logic low level in case that the target frequency of the internal clock is within the second frequency range. As a result, an output frequency range for the internal clock can be selected among the available frequency ranges in order to include a target frequency for the internal clock.

The equation 2 represents a first gain K_VCO1 of the voltage controlled oscillator when the frequency range selection signal ENb has a logic high level. The equation 3 represents a second gain K_VCO2 of the voltage controlled oscillator when the frequency range selection signal ENb has a logic low level.

$$K\_VCO1 = \frac{FRQ\_MAX1 - FRQ\_MIN}{W\_CTR} \quad \text{(Equation 2)}$$

$$K\_VCO2 = \frac{FRQ\_MAX2 - FRQ\_DC}{W\_CTR} \quad \text{(Equation 3)}$$

If the maximum output frequency FRQ_MAX of the internal clock in FIG. 4 is identical to the maximum output frequency FRQ_MAX2 of the internal clock in FIG. 9, it can be considered that the jitter characteristic of the internal clock in FIG. 9 is improved over that in FIG. 4. In addition, where the maximum output frequency FRQ_MAX of the internal clock in FIG. 4 is identical to the first output frequency FRQ_MAX1' of the internal clock in FIG. 9, the output frequency range for the internal clock in FIG. 9 is wider than that in FIG. 4.

As described above, a delay cell in accordance with the disclosure determines a delay time according the control voltage and the frequency range selection signals. The target frequency range for an output signal can be adjusted by controlling the delay time according to the condition of the PVT, thereby improving the jitter characteristic of the output signal even where the condition of PVT is the fast case. Accordingly, a phase locked loop provided with such a delay cell can adjust the target frequency range of the internal clock and improve a jitter characteristic of the internal clock.

In addition, the voltage controlled oscillator in accordance with the disclosure can adjust the frequency range of the internal clock, e.g., one of the first and second frequency ranges. A wide range of output frequencies for the internal clock can be secured without deterioration of the jitter characteristic.

While the present invention has been described in the specific disclosures, various changes and modifications may be made according to embodiments.

For example, the signal input unit 620 is provided with PMOS transistors in the first embodiment of the present invention. However, different kind of transistors, e.g., NMOS transistors, can be substituted as described in the second embodiment of the present invention. The embodied logic gates and transistors may be changed with respect to the location and kind according to the polarity of input signals. In addition, the present invention is applied to the delay cell in the voltage controlled oscillator of the phase locked loop in the described embodiments. However, the present invention may also be applied to a delay cell in a voltage controlled delay line (VCDL) of a delay locked loop (DLL).

Also, while three pairs of transistors are illustrated in the first and second embodiments, corresponding to three types TYPICAL, FAST and SLOW, the condition of PVT may be defined with more than three types. Transistors in correspondence with the number of types can be used. Additionally, the frequency range of the internal clock may be divided into more than the two ranges illustrated in the third embodiment. By this, the frequency range of the internal clock can be adjusted without deterioration of the jitter characteristic of the internal clock.

While the present invention has been described with respect to the particular embodiments, it will be apparent to those skilled in the art that various changes and modifications may be made without departing from the spirit and scope of the invention as defined in the following claims.

What is claimed is:

1. A delay cell, comprising:
    a first current controller configured to supply first and second currents to first and second nodes in response to a control voltage;
    a signal input unit configured to output differential output signals in response to differential input signals and in response to total currents flowing through the first and second nodes, respectively; and
    a second current controller configured to selectively add third and fourth currents to the first and second nodes, respectively, in response to one or more frequency range selection signals,
    wherein the second current controller receives a supply voltage, makes a current path between the supply voltage and the first and second nodes and generates the third and fourth currents in response to a predetermined bias voltage, which is different from the control voltage and the supply voltage, and supplies the third and fourth currents to the first and second nodes respectively depending on whether the one or more frequency range selection signals are activated or inactivated.

2. The delay cell of claim 1, further comprising a loading unit configured between the signal input unit and a ground voltage terminal.

3. The delay cell of claim 1, wherein the frequency range selection signals are skew information signals generated from a mode register set or a fuse option circuit.

4. The delay cell of claim 1, wherein the frequency range selection signals correspond to process, voltage and temperature (PVT) information.

5. The delay cell of claim 1, further comprising a band gap circuit configured to generate the predetermined bias voltage.

6. The delay cell of claim 5, further comprising a capacitor connected between an output node of the band gap circuit and a supply voltage terminal for the first and second current controllers.

7. The delay cell of claim 1, wherein the second current controller includes:
    a first current supplying unit configured to supply the third current to the first node in response to the predetermined bias voltage and the frequency range selection signals; and
    a second current supplying unit configured to supply the fourth current to the second node in response to the predetermined bias voltage and the frequency range selection signals.

8. The delay cell of claim 7, wherein the first current supplying unit includes:
    a current generator configured to generate the third current in response to the predetermined bias voltage; and
    a current transmitter configured to transmit the third current to the first node in response to the frequency range selection signal.

9. The delay cell of claim 7, wherein the second current supplying unit includes:
    a current generator configured to generate the fourth current in response to the bias voltage; and
    a current transmitter configured to transmit the fourth current to the second node in response to the frequency range selection signal.

10. The delay cell of claim 8, wherein the current generator and the current transmitter are connected in series between the supply voltage and the first node.

11. The delay cell of claim 8, wherein the current generator comprises a transistor having the predetermined bias voltage supplied to its gate terminal and the current transmitter comprises another transistor having one of the frequency range selection signals supplied to its gate terminal.

12. The delay cell of claim 9, wherein the current generator and the current transmitter are connected in series between the supply voltage and the second node.

13. The delay cell of claim 9, wherein the current generator comprises a transistor having the predetermined bias voltage supplied to its gate terminal and the current transmitter comprises another transistor having one of the frequency range selection signals supplied to its gate terminal.

* * * * *